US010126361B1

(12) United States Patent
Yang et al.

(10) Patent No.: US 10,126,361 B1
(45) Date of Patent: Nov. 13, 2018

(54) PROCESSING OF A CIRCUIT DESIGN FOR DEBUGGING (71) Applicant: Xilinx, Inc., San Jose, CA (US)

(72) Inventors: Xiaojian Yang, Sunnyvale, CA (US); Maogang Wang, Fremont, CA (US); Grigor S. Gasparyan, San Jose, CA (US); Raoul Badaoui, San Jose, CA (US)

(73) Assignee: XILINX, INC., San Jose, CA (US)

( * ) Notice: Subject to any disclaimer, the term of this patent is extended or adjusted under 35 U.S.C. 154(b) by 150 days.

(21) Appl. No.: 15/351,085

(22) Filed: Nov. 14, 2016

(51) Int. Cl.
*G06F 17/50* (2006.01)
*G01R 31/317* (2006.01)
*G01R 31/3177* (2006.01)

(52) U.S. Cl.
CPC ...... *G01R 31/31704* (2013.01); *G01R 31/3177* (2013.01); *G01R 31/31705* (2013.01); *G01R 31/31707* (2013.01)

(58) Field of Classification Search
CPC ............ G06F 17/5022; G06F 17/5045; G06F 17/5027
USPC ................... 716/116, 123, 124, 125
See application file for complete search history.

(56) References Cited

U.S. PATENT DOCUMENTS

| | | | | |
|---|---|---|---|---|
| 6,122,762 A * | 9/2000 | Kim | ............... | G11C 29/32 714/726 |
| 6,823,497 B2 * | 11/2004 | Schubert et al. | ... | G06F 17/5022 716/106 |
| 6,904,577 B2 * | 6/2005 | Schubert et al. | | G01R 31/31835 716/103 |
| 7,065,481 B2 * | 6/2006 | Schubert et al. | | G01R 31/31835 438/14 |
| 7,072,818 B1 * | 7/2006 | Beardslee et al. | | G01R 31/31705 703/14 |
| 7,120,892 B1 | 10/2006 | Knol et al. | | |
| 7,143,384 B1 | 11/2006 | Young et al. | | |
| 7,149,993 B1 | 12/2006 | Aggarwal | | |
| 7,222,324 B1 | 5/2007 | Kaszynski | | |
| 7,240,303 B1 * | 7/2007 | Schubert et al. | | G01R 31/31705 703/13 |
| 7,284,220 B1 | 10/2007 | Johnson | | |
| 7,356,786 B2 * | 4/2008 | Schubert et al. | | G01R 31/31705 716/106 |
| 7,467,368 B1 | 12/2008 | Singh | | |
| 7,506,286 B2 * | 3/2009 | Beardslee et al. | | G01R 31/31705 703/14 |
| 7,536,661 B1 | 5/2009 | Singh et al. | | |

(Continued)

*Primary Examiner* — Sun Lin
(74) *Attorney, Agent, or Firm* — LeRoy D. Maunu (57) ABSTRACT

Processing a circuit design that specifies application logic and debugging logic includes partitioning the circuit design. Each partition includes a part of the application logic and a part of the debugging logic, each partition is specified for implementation on a respective IC die, and the circuit design specifies connections between a part of the application logic in one partition and a part of the debugging logic in another partition. The connections between the part of the application logic in the one partition and the part of the debugging logic in the other partition are changed to connections from the part of the application logic in the one partition to a part of the debugging logic in the one partition. The part of the application logic and the part of the debugging logic of each partition are placed and routed on the respective IC die.

20 Claims, 7 Drawing Sheets

(56) References Cited

U.S. PATENT DOCUMENTS

| | | |
|---|---|---|
| 7,590,960 B1 | 9/2009 | Kong et al. |
| 7,620,927 B1 | 11/2009 | Ochotta et al. |
| 7,761,830 B1 | 7/2010 | Kaszynski |
| 7,827,510 B1 * | 11/2010 | Schubert et al. ... G06F 17/5027 716/111 |
| 7,979,831 B1 | 7/2011 | Srinivasan |
| 8,006,215 B1 | 8/2011 | Singh |
| 8,082,532 B1 | 12/2011 | Stenz et al. |
| 8,091,057 B1 | 1/2012 | Suthar et al. |
| 8,091,060 B1 | 1/2012 | Tom et al. |
| 8,205,180 B1 | 6/2012 | Anderson et al. |
| 8,219,957 B1 | 7/2012 | Gaitonde et al. |
| 8,312,405 B1 | 11/2012 | Slonim et al. |
| 8,418,115 B1 | 4/2013 | Tom et al. |
| 8,522,185 B1 | 8/2013 | Balzli, Jr. |
| 8,665,727 B1 | 3/2014 | Trimberger |

\* cited by examiner

PROCESSING OF A CIRCUIT DESIGN FOR DEBUGGING

TECHNICAL FIELD

The disclosure generally relates to debugging circuit designs.

BACKGROUND

Functional verification of circuit designs sometimes involves emulation using field programmable gate arrays (FPGAs). Stacked silicon interconnect (SSI) technology, supports emulation of a very large range of circuit designs. Stacked Silicon Interconnect (SSI) technology involves two or more integrated circuit (IC) dies mounted on a silicon interposer and communicatively coupled via signal lines in the silicon interposer.

In a specific example involving programmable logic, such as field programmable gate arrays, SSI technology combines multiple "super logic region" (SLR) components mounted on a passive silicon interposer. Compared to traditional devices, SSI technology enables construction of FPGA devices that are much larger, have more dedicated features, and have a lower power envelope than single-chip implementations.

An SLR is a single FPGA die contained in an SSI-based device. Each SLR can include the active circuitry common to most FPGA devices. This circuitry includes large numbers of look-up tables (LUTs), registers, input/output (I/O) components, gigabit transceivers (GTs), block memory (BRAM), and digital signal processing (DSP) circuits. Multiple SLRs can be assembled to make an SSI-based device.

SUMMARY

A disclosed method of processing a circuit design includes inputting the circuit design to a programmed processor. The circuit design specifies application logic and debugging logic coupled to the application logic. The processor partitions the circuit design into a plurality of partitions. Each partition includes a part of the application logic and a part of the debugging logic, each partition is specified for implementation on a respective integrated circuit (IC) die, and the circuit design specifies a plurality of connections between a part of the application logic in one partition of the plurality of partitions and a part of the debugging logic in another partition of the plurality of partitions. The processor changes the plurality of connections between the part of the application logic in the one partition and the part of the debugging logic in the other partition, to a plurality of connections from the part of the application logic in the one partition to a part of the debugging logic in the one partition. The processor then places the part of the application logic and the part of the debugging logic of each partition of the plurality of partitions on circuit resources of the respective IC die and routes the part of the application logic and the part of the debugging logic of each partition of the plurality of partitions on the respective IC die.

A system that is disclosed in this specification includes a processor and a memory coupled to the processor. The memory is configured with instructions for processing a circuit design, and execution of the instructions cause the processor to input the circuit design. The circuit design specifies application logic and debugging logic coupled to the application logic. The instructions cause the processor to partition the circuit design into a plurality of partitions. Each partition includes a part of the application logic and a part of the debugging logic, each partition is specified for implementation on a respective integrated circuit (IC) die, and the circuit design specifies a plurality of connections between a part of the application logic in one partition of the plurality of partitions and a part of the debugging logic in another partition of the plurality of partitions. The instructions further cause the processor to change the plurality of connections between the part of the application logic in the one partition and the part of the debugging logic in the other partition, to a plurality of connections from the part of the application logic in the one partition to a part of the debugging logic in the one partition. In executing the instructions, the processor places the part of the application logic and the part of the debugging logic of each partition of the plurality of partitions on circuit resources of the respective IC die and routes the part of the application logic and the part of the debugging logic of each partition of the plurality of partitions on the respective IC die.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

In support of functional verification, an electronic design automation (EDA) tool adds debugging circuitry or "debugging logic" to application logic that is to be tested. The additional debugging logic probes the signals in the application logic and is often organized in the form of several debugging modules that are connected to the application logic. The debugging logic may probe every flip-flop in the application logic, resulting in a large number of connections (on the order of tens to hundreds of thousands). The combined application logic and debugging logic can make difficult the process of placing and routing the circuit design on SSI devices. The initial combined application logic and debugging logic may be referred to as the "initial probed circuit design."

Placing and routing a circuit design having application logic and debugging logic on an SSI device will often result in connected modules of application logic and debugging logic being placed on different SLRs. When a module of application logic and the module of debugging logic to which the module of application logic is connected are placed on different SLRs, the signals from the module of application logic need to be carried from the SLR of the module of application logic to the SLR of the module of debugging logic. The limited number of inter-SLR connections on the device may prevent a viable partitioning solution to implement the connections between SLRs.

The additional connections between application logic and debugging logic may also create local routing congestion. As FPGAs have limited routing resources, placement and routing of the high density interconnects involved with debugging logic may be problematic. However, the flexibility of the interconnections between application logic and debugging logic can be used to alleviate the routing challenges. Although connections between application logic and debugging logic are initially specified in the synthesized circuit design, the place-and-route procedures of the EDA tool can change the specified connections and reduce contention for limited inter-SLR connections.

A majority of the connections from the application logic to the debugging logic are from flip-flops in the application logic to multiplexers of the debugging logic. In an ideal case, any flip-flop of the application logic can be connected to any multiplexer input of the debugging logic. In practice, however, a grouping constraint may be specified to limit changing of connections. The disclosed approaches change application logic-to-debugging logic connections during partitioning and placement phases of processing a circuit design.

The partitioning phase involves dividing the circuit design, which includes both the application logic and debugging logic, into partitions that are designated for implementation on separate IC dies (e.g., IC dies that implement SLRs). In a first stage of partitioning, the application logic is partitioned without considering the connections to debugging logic. Specific debugging logic is not considered in the partitioning. By not considering the connections from the application logic to the debugging logic and not considering the specific debugging logic for the partitions, the number of inter-die connections and timing can be reduced. Known partitioning processes may be adapted to ignore the connections and debugging logic.

Though specific debugging logic is not assigned to partitions during partitioning, the partitioning accounts for space that will be eventually needed when debugging logic is placed. For example, for each flip-flop of the application logic, additional space is reserved in a partition to account for a portion of the debugging logic that will be eventually placed in the same partition.

In a second stage of partitioning, the debugging logic is partitioned according to the partitioning result of the application logic. The multiplexer input logic, which is part of the debugging logic and can be implemented by look-up tables (LUTs) in an FPGA implementation, is partitioned such that there are sufficient multiplexer inputs in each partition to connect to all the flip-flops of the application logic in the same partition. In the presence of a grouping constraint of the interconnections, the multiplexer inputs belonging to the same group will be distributed such that each partition contains a sufficient number of multiplexer inputs to connect to the flip-flops of the same group.

In a third stage of partitioning, the connections from the application logic to the debugging logic, as specified in the initial probed circuit design, are changed such that each flip-flop in a partition is connected to a multiplexer input in the same partition. The result of the three stages of partitioning is that no connection between flip-flops in the application logic and multiplexer inputs in the debugging logic needs to travel from one IC die to another IC die. This greatly relieves the pressure on routing inter-IC nets and avoids overflow problems that can cause failure in placing and routing the circuit design.

Once the application logic and debugging logic have been partitioned, the circuit elements of the application logic and debugging logic are placed at particular locations in a partition. During global and detailed placement, the entire netlist of application logic and debugging logic is placed using recognized timing-driven placer processes of the EDA tool. The timing-driven placement can be adapted to ignore or down-weight debugging interconnects, because the debugging interconnects will be subsequently changed. The cell area of the debugging logic, however, is not ignored because the debugging logic requires considerable chip space.

After detailed placement, within each partition the specified connections between application logic and debugging logic are changed. Each flip-flop is connected to one of the multiplexer inputs such that the total wire length of the debugging interconnects is minimized. This problem can be solved optimally using bi-partite matching algorithm. A heuristic with pruned bi-partite graph edges can greatly speed up the algorithm without much loss of the solution quality. Changing application-to-debugging connections after placement greatly reduces the total routing demand of the connections and improves the chances for successfully routing the application logic and debugging logic.

Figure 1:
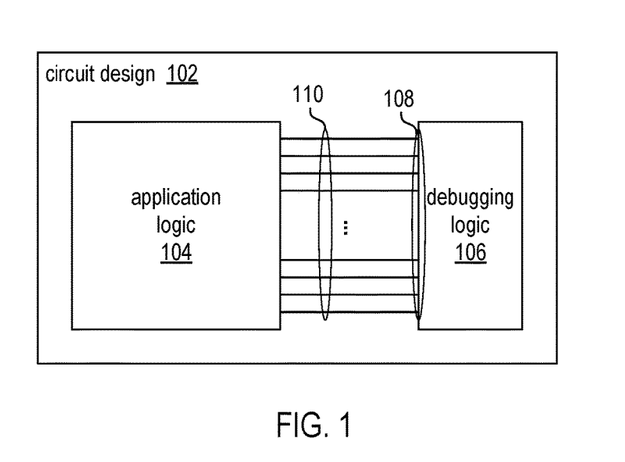
FIG. 1 shows an example of a circuit design that includes application logic 104 and debugging logic.

FIG. 1 shows an example of a circuit design 102 that includes application logic 104 and debugging logic 106. The application logic specifies a circuit that when implemented on an IC device or package, provides a desired function within a product. The application logic is logic that a designer desires to test and debug using the debugging logic. The debugging logic specifies a circuit, that when implemented on an IC device or package, probes signals of the application logic. The states of the probed signals can be stored on-chip for subsequent retrieval and analysis.

The debugging logic generally includes multiplexer logic (not shown), trigger logic (not shown), capture logic (not shown), and interface logic (not shown). Flip-flops (not shown) of the application logic are connected to multiplexer inputs 108 in the debugging logic as shown by signal lines 110. The multiplexer logic is used for selection of signals to probe and selection of signals to be input to the trigger logic. The trigger logic controls when the states of the probed signals are saved based on the states of trigger signals. The interface logic transfers the saved states of the probed signals off-chip for analysis. The debugging logic includes circuit elements such as multiplexers (not shown), look-up tables (LUTs, not shown), and flip-flops (not shown). The flip-flops are connected to output pins for providing signal states to off-chip logic.

Figure 2:
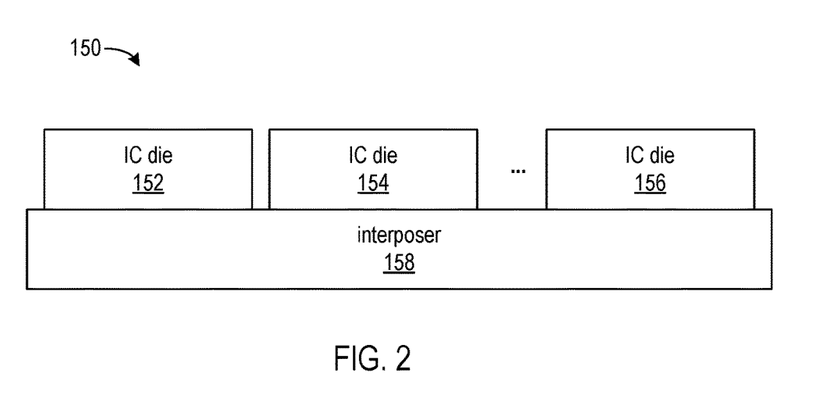
FIG. 2 shows a circuit arrangement that includes multiple IC dies mounted on and communicatively interconnected by a silicon interposer.

FIG. 2 shows a circuit arrangement 150 that includes multiple IC dies 152, 154, and 156 mounted on and communicatively interconnected by a silicon interposer 158. In an example implementation, the IC dies are FPGA SLRs. The disclosed methods and systems process the circuit design 102 (FIG. 1) for implementation on a circuit arrangement, such as circuit arrangement 150. The implementation of the circuit design 102 has portions implemented on circuit resources of each of the IC dies. The disclosed method greatly reduces or eliminates connections from flip-flops of the application logic on one of the IC dies to multiplexer inputs of debugging logic on another of the IC dies.

Figure 3:
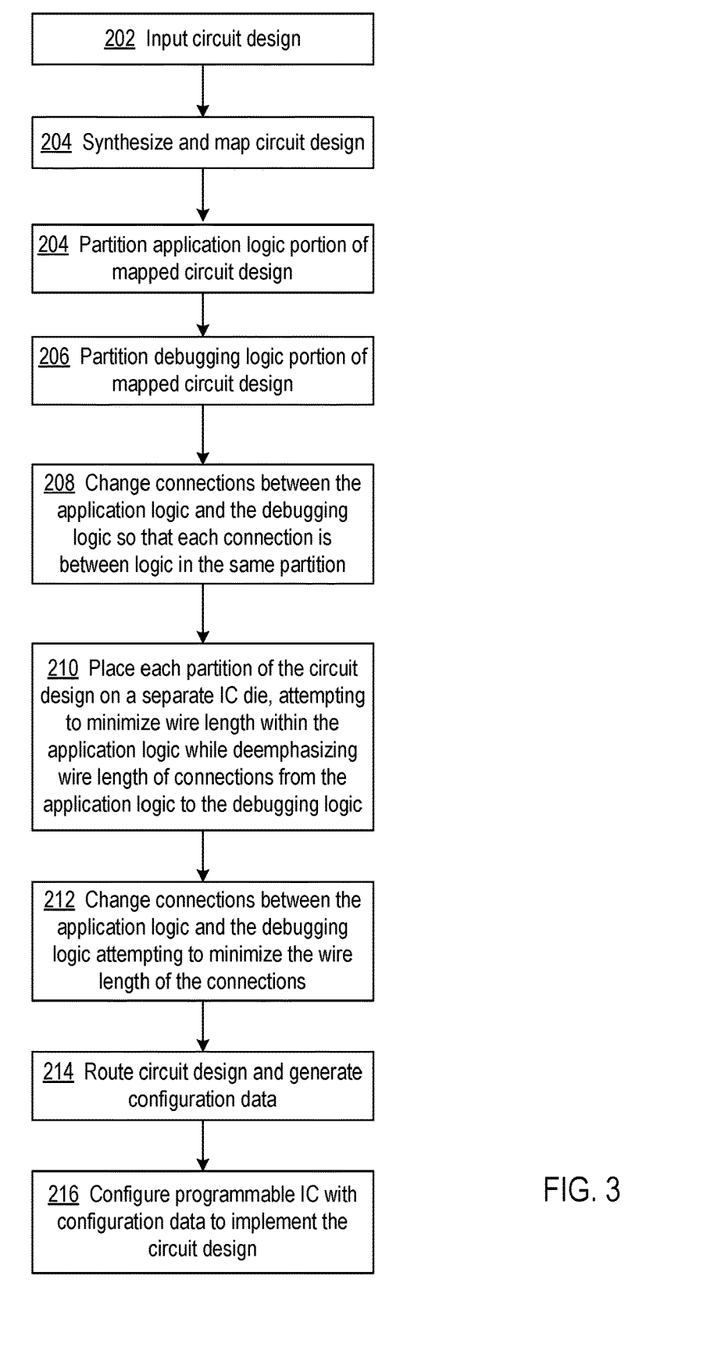
FIG. 3 shows a flowchart of a process for partitioning and placing a circuit design that includes debugging logic.

FIG. 3 shows a flowchart of a process for partitioning and placing a circuit design that includes debugging logic. The process can be implemented on an EDA tool executing on a computer system. The EDA tool inputs a circuit design at block 202. The circuit design may be specified in a hardware description language (HDL), for example. The circuit design includes application logic and debugging logic, as described above. In preparing the circuit design, the designer specifies those signals of the application logic to be probed and the trigger logic that controls capture of the signals. At block 204, the EDA tool synthesizes and maps the circuit design to circuit resources of a target device, such as the circuit resources of the circuit arrangement 150 of FIG. 2.

At block 204, the EDA tool partitions the application logic of the circuit design into different partitions. Each partition of application logic is designated for implementation on a separate IC die. That is no two partitions are designated for the same IC die. The application logic is partitioned without considering the connections to debugging logic. Specific debugging logic is not considered in the partitioning. By not considering the connections from the application logic to the debugging logic and not considering the specific debugging logic for the partitions, the number of inter-die connections can be reduced. Though specific debugging logic is not involved in the partitioning of the application logic, the EDA tool allows for extra resources when placing flip-flops of the application logic to account for the multiplexer logic to which each flip-flop will eventually be connected. Known partitioning processes may be adapted to ignore the connections and debugging logic.

The EDA tool partitions the debugging logic at block 206. The multiplexers are partitioned such that there are sufficient multiplexer inputs in each partition to connect to all the flip-flops of the application logic in the same partition.

After the partitioning of blocks 204 and 206, each partition includes a part of the application logic and a part of the debugging logic. The EDA tool specifies each partition for implementation on a respective integrated circuit (IC) die.

As the EDA tool did not consider the specific connections between the application logic and the debugging logic when partitioning the circuit design, at least some of the connections are between logic in different partitions. That is, connections are specified between a part of the application logic in one partition and a part of the debugging logic in another partition. Relative to the circuit arrangement 150 of FIG. 2, a part of the application logic may be designated for implementation on IC die 152, and a part of the debugging logic may be designated for implementation on IC die 156. The partitions would then require inter-die connections through the interposer 158 for connecting the application logic to the debugging logic. Such a partitioning may make a final placement and routing unfeasible due to the number of inter-die connections for handling application-to-debugging logic signals relative to the number of input/output pins available on the IC dies.

To reduce or eliminate the number of inter-die connections for handling application-to-debugging logic signals, the EDA tool at block 208 changes the originally specified connections from the application logic to the debugging logic such that the signals of the application logic in a partition are connected to multiplexer inputs of the debugging logic in the same partition. For example, if the original design specified connections from a part of the application logic partitioned for implementation on IC die 152 and a part of the debugging logic partitioned for implementation on IC die 156, the connections are changed such that the signals from the part of the application logic partitioned for implementation on IC die 152 are reconnected to multiplexer inputs of the part of the debugging logic that is partitioned for implementation also on IC die 152.

At block 210, the EDA tool places the application logic and the debugging logic in each partition. Global placement and detailed placement are generally part of the placement process. The global placement process attempts to determine a well spread, ideally with no overlaps, placement of the cells for a given netlist, such that the placement attains the required objectives such as wire length minimization or timing specifications. Some global placement algorithms include analytic techniques which approximate the wire length objective using quadratic or nonlinear formulations, partitioning-based placement algorithms and stochastic techniques. The detailed placement process attempts to legalize the result from global placement with as little cell movement as possible. In addition, detailed placement has more concrete objectives on meeting the timing specifications and minimizing wire length.

For the application logic, the placement process uses timing constraints of the application logic to select suitable locations of circuit resources for placement on an IC. For the debugging logic, the placement process places the debugging logic on circuit resources of the IC die independent of timing constraints on connections from the application logic to the debugging logic. As the connections from the application logic to the debugging logic will be subsequently changed, considering timing constraints on the connections when placing the debugging logic is unnecessary, which improves processing speed of the EDA tool on the computer system.

Figure 6:
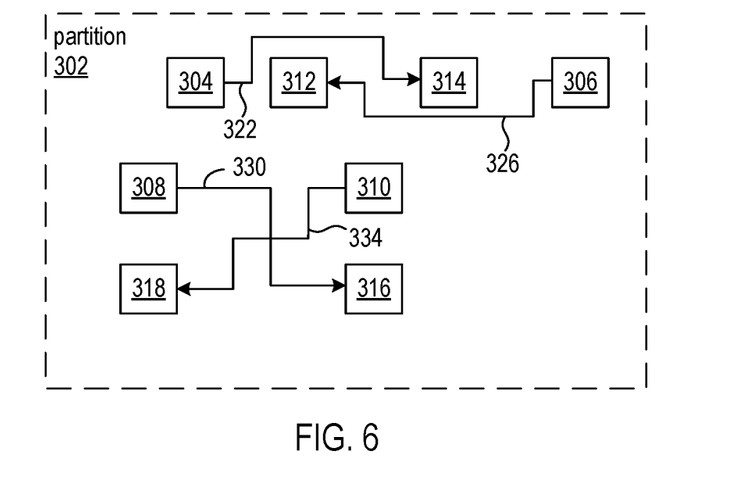
FIG. 6 shows logic elements of application logic connected to logic elements of debugging logic.
Figure 7:
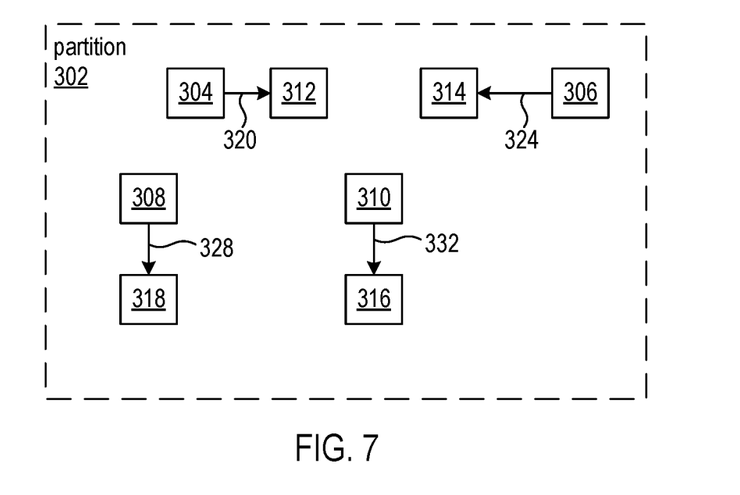
FIG. 7 shows how the connections from the placed application logic elements to the placed debugging logic elements can be changed to reduce the total wire length of the connections.

At block 212, the EDA tool changes connections between the application logic and the debugging logic in order to reduce the total wire length of the connections. The application logic in a partition is connected to debugging logic in the same partition, and the connections may be improved by changing the connections such that the total wire length of those connections is reduced. FIGS. 6 and 7 show an example in which the total wire length is reduced by changing within a partition which multiplexer inputs of the debugging logic are connected to which the flip-flops of the application logic.

The EDA tool routes the placed circuit design and generates configuration data from the placed and routed circuit design at block 214. Bitstream generation tools may be executed to generate configuration data for an FPGA in an example implementation. At block 216, a programmable IC can be configured with the configuration data, thereby creating a circuit that operates according to the circuit design as modified to include the debugging logic.

Figure 4:
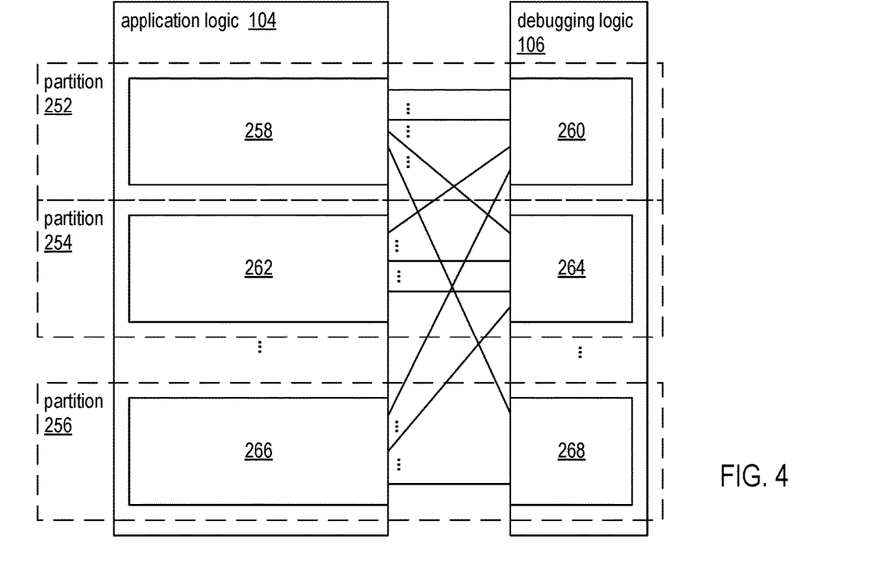
FIG. 4 shows an example in which application logic and debugging logic are partitioned and connections are specified between a part of the application logic in one partition and a part of the debugging logic in another partition.
Figure 5:
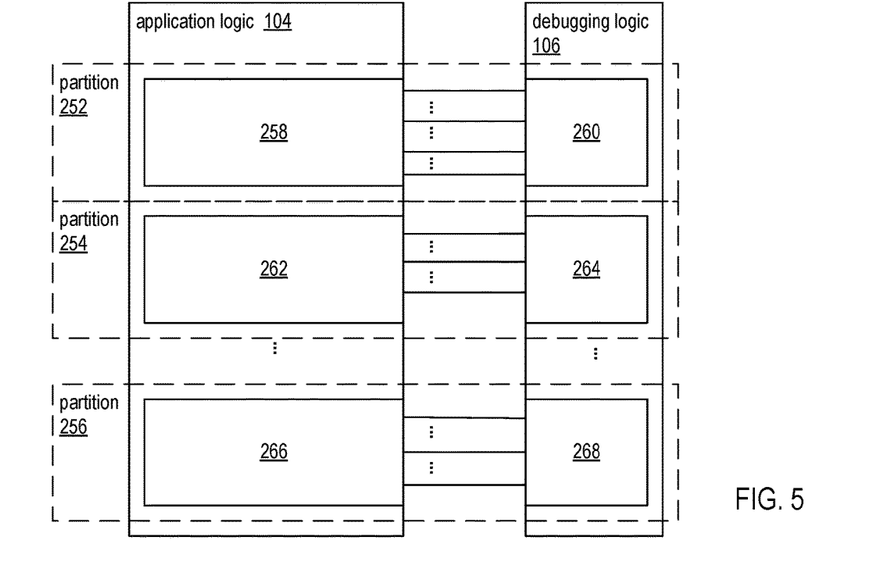
FIG. 5 continues the example of FIG. 4 and shows the connections having been changed such that the connected parts of the application logic and debugging logic are in the same partition.

FIG. 4 shows an example in which application logic and debugging logic are partitioned and connections are specified between a part of the application logic in one partition and a part of the debugging logic in another partition. FIG. 5 continues the example of FIG. 4 and shows the connections having been changed such that the connected parts of the application logic and debugging logic are in the same partition.

FIG. 4 shows application logic 104 and debugging logic 106 having been partitioned into partitions 252, 254, and 256. Portion 258 of the application logic and portion 260 of the debugging logic are assigned to partition 252, portion 262 of the application logic and portion 264 of the debugging logic are assigned to partition 254, and portion 266 of the application logic and portion 268 of the debugging logic are assigned to partition 256.

Each of the portions of the application logic is connected to portions of the debugging logic in different partitions. Portion 258 of the application logic is connected to portions 264 and 268 of the debugging logic in partitions 254 and 256. Portion 262 of the application logic is connected to portion 260 of debugging logic in partition 252. Portion 266 of the application logic is connected to portions of the debugging logic in partitions 252 and 254.

FIG. 5 shows connections between application logic 104 and debugging logic 106 having been changed from the connections shown in FIG. 4 such that the portion of the application logic in each partition is connected only to the portion of the debugging logic in the same partition. Portion 258 of the application logic is connected only to the portion 260 of the debugging logic in partition 252, portion 262 of the application logic is connected only to the portion 264 of the debugging logic in partition 254, and portion 266 of the application logic is connected only to the portion 268 of the debugging logic in partition 256.

FIGS. 6 and 7 show an example in which logic elements of a portion of application logic and logic elements of a portion of debugging logic have been placed in a partition, and connections changed in order to reduce the total wire length of the connections. FIG. 6 shows logic elements 304, 306, 308, and 310 of application logic connected to logic elements 312, 314, 316, and 318 of debugging logic, respectively. The logic elements of the application logic may be flip-flops, and the logic elements of the debugging logic may be multiplexer inputs, for example. The connections shown in FIG. 6 may be the result after completing the processing of block 208 of FIG. 3.

FIG. 7 shows how the connections from the placed application logic elements to the placed debugging logic elements can be changed to reduce the total wire length of the connections, such as by the processing of block 212 of FIG. 3. The connection from application logic element 304 is changed from debugging logic element 314 to debugging logic element 312, the connection from application logic element 306 is changed from debugging logic element 312 to debugging logic element 314, the connection from application logic element 308 is changed from debugging logic element 316 to debugging logic element 318, and the connection from application logic element 310 is changed from debugging logic element 318 to debugging logic element 316.

The example easily illustrates that the total wire length of the connections shown in FIG. 7 is less than the total wire length of the connections shown in FIG. 6. The wire length of new connection 320 is less than the wire length of connection 322 (FIG. 6), the wire length of new connection 324 is less than the wire length of connection 326 (FIG. 6), The wire length of new connection 328 is less than the wire length of connection 330 (FIG. 6), and the wire length of new connection 332 is less than the wire length of connection 334.

An additional feature of the disclosed methods and system is that signals from the application logic elements can be grouped to restrict partitioning and connections to the debugging logic. The circuit designer may specify through the user interface provided by the EDA tool, subsets of signals from the application logic elements to include in desired groups. During partitioning (FIG. 3, block 204), flip-flops that are sources of signals within the same group are assigned to the same partition. For each group, a corresponding portion of debugging logic is assigned to the same partition and to that group (FIG. 3, block 206).

Figure 8:
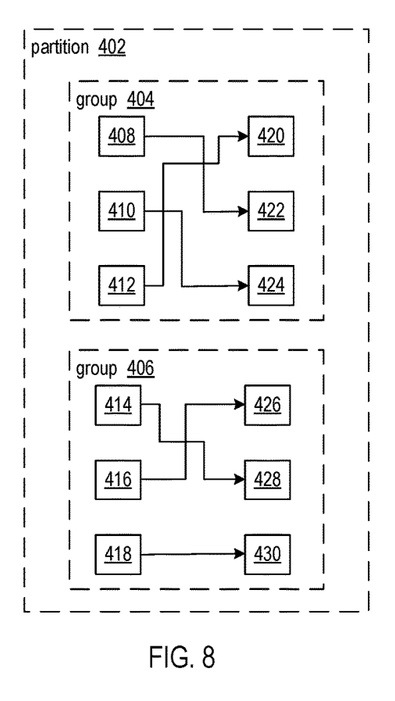
FIG. 8 shows an example of a partition having groups of connections from placed application logic elements to placed debug logic elements.

Multiple groups may be assigned to a partition. In the interconnect reconfiguration that occurs after placement of the application logic and debugging logic (FIG. 3, block 212), connections of the signals within a group to debugging logic are restricted to the portion of debugging logic assigned to that group FIG. 8 shows an example of a partition 402 having groups 404 and 406 of connections from placed application logic elements to placed debug logic elements. The application logic elements 408, 410, and 412, the signals from the application logic elements, and the debugging logic elements 420, 422, and 424 are assigned to group 404, and the application logic elements 414, 416, and 418, the signals from the application logic elements, and the debugging logic elements 426, 428, and 430 are assigned to group 406.

Figure 9:
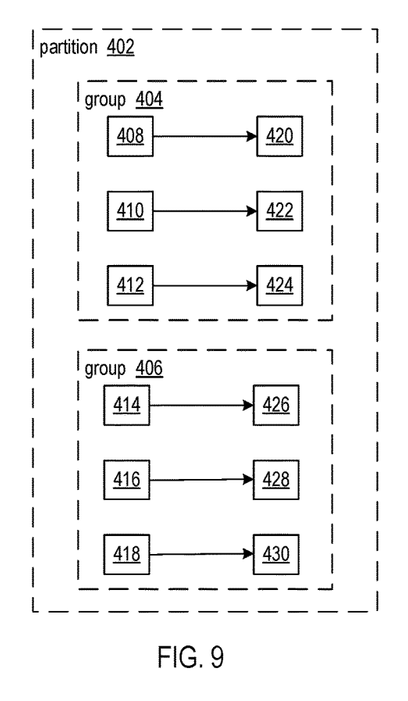
FIG. 9 shows the result of changing the connections within each group of the connections shown in FIG. 8.

Within each group, the total wire length of the connections from the application logic elements to the debugging logic elements can be reduced by changing the connections. FIG. 9 shows the result of changing the connections within each group of the connections shown in FIG. 8, according to the processing of block 212 (FIG. 3).

When changing the connections from the application logic elements to the debugging logic elements, the EDA tool restricts the changes such that a connection from an application logic element is limited to a debugging logic element in the same group. For example, in FIG. 8 application logic element 408 is connected to debugging logic element 422 in group 404. The possible alternative connections for the application logic element 408 are connections to debugging logic elements 420 and 424 that are also in group 404. The connection from application logic element 408 is changed to debugging logic element 420 as the connection provides a shorter wire length than a connection to debugging logic element 424. Changes to the connections from the application logic elements in group 406 are similarly restricted to debugging logic elements in group 406.

Figure 10:
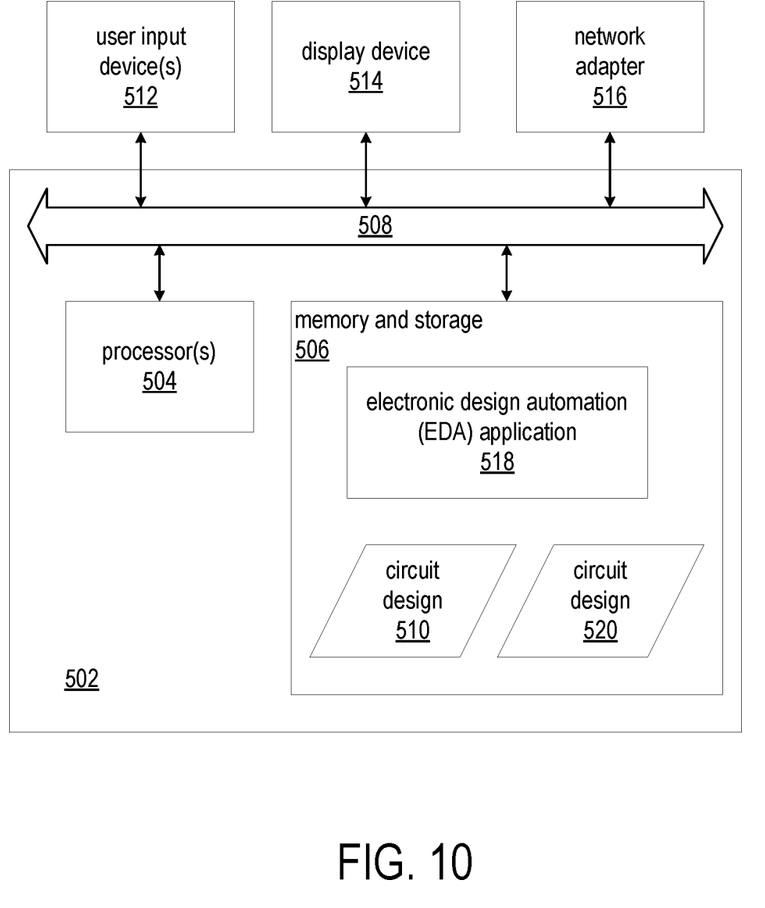
FIG. 10 is a block diagram illustrating an exemplary data processing system.

FIG. 10 is a block diagram illustrating an exemplary data processing system (system) 502. System 502 is an example of an EDA system. As pictured, system 502 includes at least one processor circuit (or "processor"), e.g., a central processing unit (CPU) 504 coupled to memory and storage arrangement 506 through a system bus 508 or other suitable circuitry. System 502 stores program code and circuit design 510 within memory and storage arrangement 506. Processor 504 executes the program code accessed from the memory and storage arrangement 506 via system bus 508. In one aspect, system 502 is implemented as a computer or other data processing system that is suitable for storing and/or executing program code. It should be appreciated, however, that system 502 can be implemented in the form of any system including a processor and memory that is capable of performing the functions described within this disclosure.

Memory and storage arrangement 506 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 502 may also include one or more cache memories (not shown) that provide temporary storage of at least some program code and data in order to reduce the number of times program code and data must be retrieved from local memory and persistent storage during execution.

Input/output (I/O) devices such as user input device(s) 512 and a display device 514 may be optionally coupled to system 502. The I/O devices may be coupled to system 502 either directly or through intervening I/O controllers. A network adapter 516 also can be coupled to system 502 in order to couple system 502 to other systems, computer systems, remote printers, and/or remote storage devices through intervening private or public networks. Modems, cable modems, Ethernet cards, and wireless transceivers are examples of different types of network adapter 516 that can be used with system 502.

Memory and storage arrangement 506 may store an EDA application (or "tool") 518. EDA application 518, being implemented in the form of executable program code, is executed by processor(s) 504. As such, EDA application 518 is considered part of system 502. System 502, while executing EDA application 518, receives and operates on circuit design 514. In one aspect, system 502 performs a design flow on circuit design 510, and the design flow may include synthesis, mapping, placement, routing, and the application of one or more physical optimization techniques as described herein. System 502 generates an optimized, or modified, version of circuit design 510 as circuit design 520.

EDA application 518, circuit design 510, circuit design 520, and any data items used, generated, and/or operated upon by EDA application 518 are functional data structures that impart functionality when employed as part of system 502 or when such elements, including derivations and/or modifications thereof, are loaded into an IC such as a programmable IC causing implementation and/or configuration of a circuit design within the programmable IC.

Figure 11:
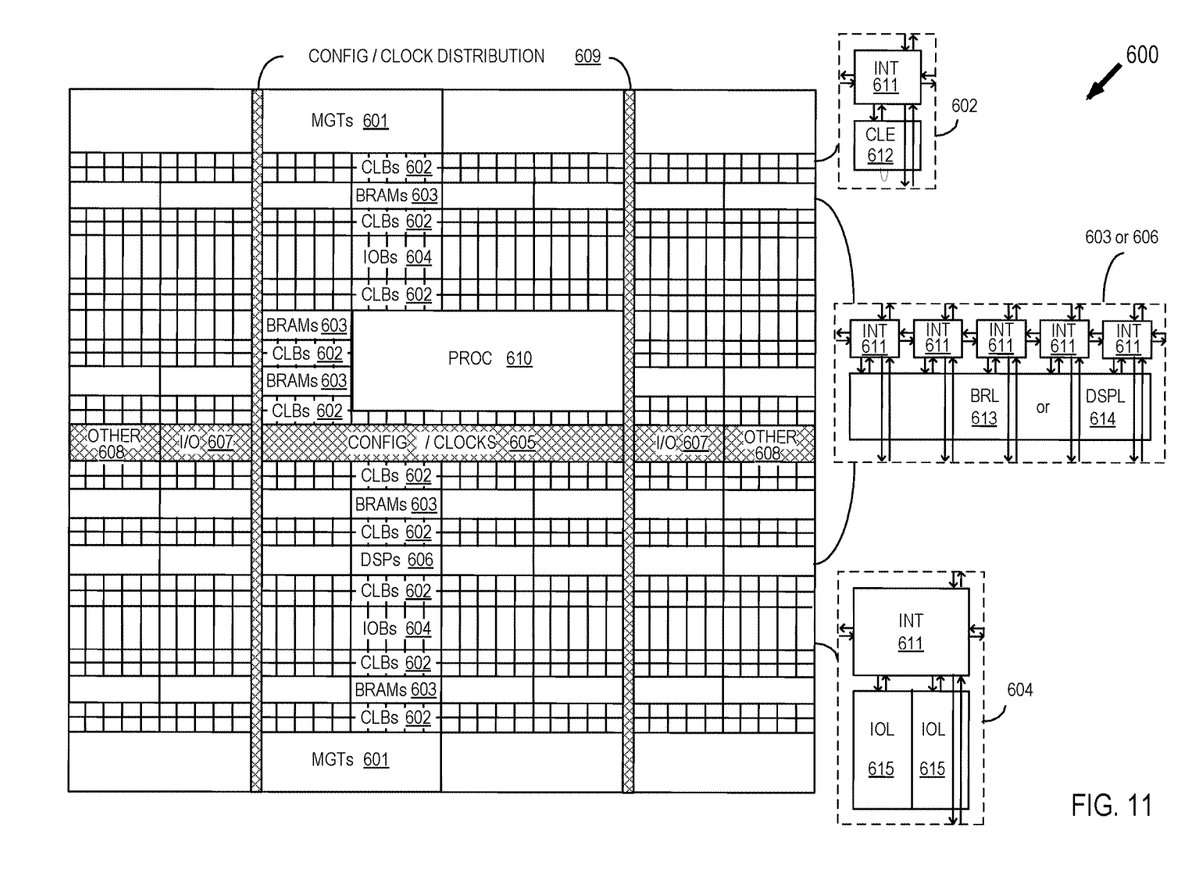
FIG. 11 shows a programmable integrated circuit (IC) on which the disclosed circuits and processes may be implemented.

FIG. 11 shows a programmable integrated circuit (IC) 600 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 11 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 11.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

In the pictured embodiment, a columnar area near the center of the die (shown shaded in FIG. 11) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 11 include additional logic blocks that disrupt the regular columnar structure making up a large part of the programmable IC. The additional logic blocks can be programmable blocks and/or dedicated logic. For example, the processor block PROC 610 shown in FIG. 11 spans several columns of CLBs and BRAMs.

Note that FIG. 11 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for combining debugging logic with application logic. Other aspects and features will be apparent to those skilled in the art from consideration of the specification. It is intended that the specification and drawings be considered as examples only, with a true scope of the invention being indicated by the following claims.

What is claimed is:

1. A method of processing a circuit design, the method comprising:
    inputting the circuit design to a programmed processor, wherein the circuit design specifies application logic and debugging logic coupled to the application logic;
    partitioning the circuit design into a plurality of partitions, wherein each partition includes a part of the application logic and a part of the debugging logic, each partition is specified for implementation on a respective integrated circuit (IC) die, and the circuit design specifies a plurality of connections, between the part of the application logic in one partition of the plurality of partitions and the part of the debugging logic in another partition of the plurality of partitions;
    changing the plurality of connections, between the part of the application logic in the one partition and the part of the debugging logic in the other partition, to a plurality of connections from the part of the application logic in the one partition to a part of the debugging logic in the one partition;
    placing the part of the application logic and the part of the debugging logic of each partition of the plurality of partitions on circuit resources of the respective IC die; and
    routing the part of the application logic and the part of the debugging logic of each partition of the plurality of partitions on the respective IC die.

2. The method of claim 1, wherein:
    the part of the application logic in each partition includes a first plurality of logic elements, the part of the debugging logic in each partition includes a second plurality of logic elements, and after the placing, logic elements of the first plurality of logic elements are connected by first connections to logic elements of the second plurality of logic elements in a same partition; and
    the method further includes, after the changing the plurality of connections, changing one or more of the first connections between the logic elements of the first plurality of logic elements and the logic elements of the second plurality of logic elements thereby making second connections from logic elements of the first plurality of logic elements to logic elements of the second plurality of logic elements, such that a total wire length of the second connections is less than a total wire length of the first connections.

3. The method of claim 2, wherein the logic elements of the first plurality of logic elements are flip-flops.

4. The method of claim 3, wherein the logic elements of the second plurality of logic elements are multiplexers.

5. The method of claim 2, wherein:
    the circuit design specifies a plurality of groups, and each group includes a subset of connections from logic elements of the application logic to logic elements of the debugging logic; and
    the changing one or more of the first connections includes, for each group, restricting the changing of a connection between a first logic element of the application logic and a first logic element of the debugging logic indicated by the subset of connections of said each group, to a connection from the first logic element to another logic element of the debugging logic in said each group.

6. The method of claim 5, wherein the placing includes:
    placing the part of the application logic on circuit resources of the respective IC die based on timing constraints on the part of the application logic; and
    placing the part of the debugging logic on circuit resources of the respective IC die independent of timing constraints on connections from the part of the application logic to the part of the debugging logic.

7. The method of claim 2, wherein the placing includes:
    placing the part of the application logic on circuit resources of the respective IC die based on timing constraints on the part of the application logic; and
    placing the part of the debugging logic on circuit resources of the respective IC die independent of timing constraints on connections from the part of the application logic to the part of the debugging logic.

8. The method of claim 1, wherein each IC die is a field programmable gate array (FPGA).

9. The method of claim 1, further comprising:
    generating configuration data that implements the circuit design from placed and routed parts of the application logic and debugging logic of the plurality of partitions; and
    configuring a programmable IC with the configuration data to implement the circuit design on the programmable IC.

10. The method of claim 1, wherein the placing includes:
    placing the part of the application logic on circuit resources of the respective IC die based on timing constraints on the part of the application logic; and
    placing the part of the debugging logic on circuit resources of the respective IC die independent of timing constraints on connections from the part of the application logic to the part of the debugging logic.

11. A system, comprising:
    a processor;
    a memory coupled to the processor, wherein the memory is configured with instructions for processing a circuit design, and execution of the instructions cause the processor to perform operations including:
        inputting the circuit design, wherein the circuit design specifies application logic and debugging logic coupled to the application logic;
        partitioning the circuit design into a plurality of partitions, wherein each partition includes a part of the application logic and a part of the debugging logic, each partition is specified for implementation on a respective integrated circuit (IC) die, and the circuit design specifies a plurality of connections between the part of the application logic in one partition of the plurality of partitions and the part of the debugging logic in another partition of the plurality of partitions;
        changing the plurality of connections, between the part of the application logic in the one partition and the part of the debugging logic in the-other partition, to a plurality of connections from the part of the application logic in the one partition to a part of the debugging logic in the one partition;
        placing the part of the application logic and the part of the debugging logic of each partition of the plurality of partitions on circuit resources of the respective IC die; and routing the part of the application logic and the part of the debugging logic of each partition of the plurality of partitions on the respective IC die.

12. The system of claim 11, wherein:
the part of the application logic in each partition includes a first plurality of logic elements, the part of the debugging logic in each partition includes a second plurality of logic elements, and after the placing, logic elements of the first plurality of logic elements are connected by first connections to logic elements of the second plurality of logic elements in a same partition; and
the execution of the instructions further cause the processor to, after the changing the plurality of connections, change one or more of the first connections between the logic elements of the first plurality of logic elements and the logic elements of the second plurality of logic elements thereby making second connections from logic elements of the first plurality of logic elements to logic elements of the second plurality of logic elements, such that a total wire length of the second connections is less than a total wire length of the first connections.

13. The system of claim 12, wherein the logic elements of the first plurality of logic elements are flip-flops.

14. The system of claim 13, wherein the logic elements of the second plurality of logic elements are multiplexers.

15. The system of claim 12, wherein:
the circuit design specifies a plurality of groups, and each group includes a subset of connections from logic elements of the application logic to logic elements of the debugging logic; and
the instructions for changing one or more of the first connections includes, for each group, instructions for restricting the changing of a connection between a first logic element of the application logic and a first logic element of the debugging logic indicated by the subset of connections of said each group, to a connection from the first logic element to another logic element of the debugging logic in said each group.

16. The system of claim 15, wherein the instructions for placing include instructions for:
placing the part of the application logic on circuit resources of the respective IC die based on timing constraints on the part of the application logic; and
placing the part of the debugging logic on circuit resources of the respective IC die independent of timing constraints on connections from the part of the application logic to the part of the debugging logic.

17. The system of claim 12, wherein the instructions for placing include instructions for:
placing the part of the application logic on circuit resources of the respective IC die based on timing constraints on the part of the application logic; and
placing the part of the debugging logic on circuit resources of the respective IC die independent of timing constraints on connections from the part of the application logic to the part of the debugging logic.

18. The system of claim 11, wherein each IC die is a field programmable gate array (FPGA).

19. The system of claim 11, wherein the memory is further configured with instructions that when executed by the processor cause the processor to:
generate configuration data that implements the circuit design from placed and routed parts of the application logic and debugging logic of the plurality of partitions; and
configure a programmable IC with the configuration data to implement the circuit design on the programmable IC.

20. The system of claim 11, wherein the instructions for placing include instructions for:
placing the part of the application logic on circuit resources of the respective IC die based on timing constraints on the part of the application logic; and
placing the part of the debugging logic on circuit resources of the respective IC die independent of timing constraints on connections from the part of the application logic to the part of the debugging logic.

\* \* \* \* \*